United States Patent
Nakagawa

(10) Patent No.: US 7,026,674 B2
(45) Date of Patent: Apr. 11, 2006

(54) SEMICONDUCTOR MEMORY DEVICE AND MANUFACTURING METHOD THEREOF

(75) Inventor: Takashi Nakagawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/740,439

(22) Filed: Dec. 22, 2003

(65) Prior Publication Data
US 2004/0129964 A1 Jul. 8, 2004

(30) Foreign Application Priority Data
Dec. 26, 2002 (JP) .............................. 2002-377474

(51) Int. Cl.
*H01L 29/76* (2006.01)
*H01L 29/94* (2006.01)

(52) U.S. Cl. ..................................... 257/295; 257/296

(58) Field of Classification Search ........ 257/295–297, 257/300; 438/240
See application file for complete search history.

(56) References Cited

U.S. PATENT DOCUMENTS 6,165,622 A * 12/2000 Kijima et al. ............... 428/469
6,841,817 B1 * 1/2005 Kurasawa et al. .......... 257/295

FOREIGN PATENT DOCUMENTS

| JP | 2000-31399 | 1/2000 |
| JP | 2000-58525 | 2/2000 |
| JP | 2000-67650 | 3/2000 |
| JP | 2003-142659 | 5/2003 |

* cited by examiner

*Primary Examiner*—Phat X. Cao
*Assistant Examiner*—Theresa T. Doan
(74) *Attorney, Agent, or Firm*—Young & Thompson

(57) ABSTRACT

A semiconductor memory device includes a capacitor which comprises a ferroelectric layer with the perovskite crystal structure which, being expressed by the general formula $ABO_3$, contains lead (Pb) as the element A occupying lattice A and zirconium (Zr) and titanium (Ti) as the element B occupying lattice B, and a lower electrode and an upper electrode which are disposed to sandwich the ferroelectric layer. The ferroelectric layer has, both on the side of the lower electrode and on the side of the upper electrode, a region each, in which a ratio of Zr to Ti (a Zr/Ti ratio) is equal to or greater than a Zr/Ti ratio of the central section of the ferroelectric layer in the direction of thickness, and the Zr/Ti ratio of at least one of the regions on the side of the lower electrode and on the side of the upper electrode is greater than the Zr/Ti ratio of the central section.

13 Claims, 5 Drawing Sheets

(a-1)

(a-2)

(b-1)

(b-2)

(c-1)

(c-2)

SEMICONDUCTOR MEMORY DEVICE AND MANUFACTURING METHOD THEREOF

BACKGROUND OF THE INVENTION

1. Field of the Invention

The present invention relates to a semiconductor memory device having a ferroelectric capacitor and a manufacturing method thereof.

2. Description of the Related Art

In recent years, wide investigations have been being conducted to develop the non-volatile semiconductor memory device with the capacitor in which polarization characteristics of the ferroelectric material are made good use of.

The ferroelectric materials used in these non-volatile semiconductor memory devices are crystals with the perovskite structure, and, among these materials, lead zirconate titanate (PZT), expressed by $Pb(Zr_xTi_{1-x})O_3$, is generally regarded to be typical one.

As a capacitor utilizing a ferroelectric material, there has been disclosed, for example, in Japanese Patent Application Laid-open No. 31399/2000 a dielectric element with a structure in which two electrodes are separated by a dielectric substance of $Pb(Zr_xTi_{1-x})O_3$, wherein the Zr composition ratio x is smaller in the vicinity of the afore-mentioned electrodes than in the central section of the afore-mentioned dielectric substance. Further, it is therein described that, by setting the composition in the vicinity of the electrodes fit to excel in lattice matching and the composition in the central section of the dielectric substance fit to excel in polarization characteristics, this structure can raise the remanent polarization and provide the dielectric substance free from a risk of the film peeling-off.

Further, in Japanese Patent Application Laid-open No. 67650/2000, there is disclosed a ferroelectric thin film element which comprises a conductive thin film formed on a single crystal substrate and a thin film of a $Pb(Zr, Ti)O_3$-based ferroelectric substance with the perovskite structure formed on the afore-mentioned conductive thin film, the afore-mentioned ferroelectric thin film being formed of a first layer having the Zr content which gradually increases with the film thickness from the interface with the afore-mentioned conductive thin film and a second layer formed to overlie the afore-mentioned first layer and have a constant Zr content throughout, wherein the compositions of the first layer and the second layer in the vicinity of the border between these two layers are practically identical. Further, it is described therein that this structure can provide a ferroelectric thin film element having a ferroelectric thin film of good orientation with a few crystal defects.

Meanwhile, in Japanese Patent Application Laid-open No. 58525/2000, there is disclosed a method of forming a ferroelectric film such as PZT by the metal organic chemical vapor deposition (MOCVD) method, wherein the film deposition can be carried out at a low temperature and a ferroelectric film of good orientation and excellent crystalline quality can be obtained without degrading plugs, interconnections or transistors in lower layers. More specifically, on a conductive material, the early-nucleation in the perovskite crystal structure is made under first conditions of the film deposition, and then, on the early-nucleus, a film with the perovskite crystal structure is grown under second conditions of the film deposition. Thereat, the early-nucleation under first conditions of the film deposition is made either under the condition that the feeding rate of Zr is reduced in comparison with that under second conditions of the film deposition or under the condition the source gas of Zr is not fed at all.

Further, in Japanese Patent Application No. 336083/2001. it is mentioned that, using the method of the film deposition described in Japanese Patent Application Laid-open No. 58525/2000, the Zr/Ti ratio in the ferroelectric film is made to increase from the side of a lower electrode towards the side of an upper electrode, with the object of reducing the lattice distortion on the interface between the early-nucleus lying on the conductive material and the ferroelectric film formed thereon. That is, by making the Zr/Ti ratio on the side of the lower electrode small, the lattice distortion may be reduced, and by making the Zr/Ti ratio towards the side of the upper electrode increase, the increasing coercive electric field can be suppressed.

Nevertheless, every one of the above techniques have a problem of an increase in leakage current because the ferroelectric film has a region where the Zr/Ti ratio is lower than that of the central section of that ferroelectric film in the direction of thickness.

SUMMARY OF THE INVENTION

An object of the present invention is to provide a semiconductor memory device having a ferroelectric capacitor, wherein a leakage current is well suppressed without reducing a value of remanent polarization.

According to a first aspect of the present invention, there is provided that a semiconductor memory device having a capacitor which comprises a ferroelectric layer with the perovskite crystal structure which, being expressed by the general formula $ABO_3$, contains lead (Pb) as the element A occupying lattice A and zirconium (Zr) and titanium (Ti) as the element B occupying lattice B, and a lower electrode and an upper electrode which are disposed to sandwich said ferroelectric layer; wherein said ferroelectric layer has, both on the side of said lower electrode and on the side of said upper electrode, a region each, in which a ratio of Zr to Ti (a Zr/Ti ratio) is equal to or greater than a Zr/Ti ratio of the central section of said ferroelectric layer in the direction of thickness, and the Zr/Ti ratio of at least one of the regions on the side of said lower electrode and on the side of said upper electrode is greater than the Zr/Ti ratio of said central section.

According to a second aspect of the present invention, there is provided that a semiconductor memory device as the first aspect, wherein said ferroelectric layer has a first ferroelectric layer which is formed on said lower electrode and a second ferroelectric layer which is formed on said first ferroelectric layer and adjacent to said upper electrode, and a Zr/Ti ratio of said first ferroelectric layer is greater than a Zr/Ti ratio of said second ferroelectric layer.

According to a third aspect of the present invention, there is provided that a semiconductor memory device as the first aspect, wherein said ferroelectric layer has a first ferroelectric layer which is formed on said lower electrode and a second ferroelectric layer which is formed on said first ferroelectric layer and adjacent to said upper electrode, and a Zr/Ti ratio of said second ferroelectric layer is greater than a Zr/Ti ratio of said first ferroelectric layer.

According to a fourth aspect of the present invention, there is provided that a semiconductor memory device as the first aspect, wherein said ferroelectric layer has a first ferroelectric layer which is formed on said lower electrode, a second ferroelectric layer which is formed on said first ferroelectric layer and a third ferroelectric layer which is formed on said second ferroelectric layer and adjacent to said upper electrode, and Zr/Ti ratios of said first and third ferroelectric layers are greater than a Zr/Ti ratio of said second ferroelectric layer.

According to a fifth aspect of the present invention, there is provided that a semiconductor memory device as one of the first to fourth aspect, which further comprises, on said lower electrode, a growth-nucleus layer with the perovskite crystal structure, wherein said ferroelectric layer is formed to overlie said growth-nucleus layer.

According to a sixth aspect of the present invention, there is provided that a method of manufacturing a semiconductor memory device as the fifth aspect, which comprises the steps of:

forming a conductive film that is to be used to form the lower electrode;

forming a growth-nucleus layer by the metal organic chemical vapor deposition method after said conductive film is formed;

forming a ferroelectric film by the metal organic chemical vapor deposition method after said growth-nucleus layer is formed; and forming a conductive film that is to be used to form the upper electrode after said ferroelectric film is formed.

According to a seventh aspect of the present invention, there is provided that a method of manufacturing a semiconductor memory device as the sixth aspect, wherein, in the step of forming said ferroelectric film, a deposition rate to form a region on the lower electrode side is set lower than a deposition rate to form the central section of said ferroelectric layer in the direction of thickness.

According to a eighth aspect of the present invention, there is provided that a method of manufacturing a semiconductor memory device as the sixth or seventh aspect, wherein, in the step of forming said ferroelectric film, a deposition rate to form a region on the upper electrode side is set lower than a deposition rate to form the central section of said ferroelectric layer in the direction of thickness.

According to a ninth aspect of the present invention, there is provided that a method of manufacturing a semiconductor memory device as the sixth, seventh or eighth aspect, wherein, in the step of forming said ferroelectric film, even when a source feeding rate is altered for the purpose of regulating the composition of said ferroelectric film along the direction of thickness, the film deposition is continuously carried out without setting the step of standing by in which no source material is supplied onto the film surface in course of formation.

The present invention can provide a ferroelectric capacitor wherein the leakage current is well-suppressed without lowering the value of the remanent polarization, and, thus, a semiconductor memory device of high reliability with excellent capacitor characteristics can be obtained. In particular, the successful suppression of the leakage current facilitates to achieve the lower voltage for the capacitor characteristics.

DETAILED DESCRIPTION OF THE INVENTION

A ferroelectric layer in the present invention is formed of a material with the perovskite crystal structure (referred to as a "Pb-based ferroelectric material" hereinafter) which, being expressed by the general formula $ABO_3$, contains lead (Pb) as the element A occupying lattice A and zirconium (Zr) and titanium (Ti) as the element B occupying lattice B.

For this Pb-based ferroelectric material, any substance expressed by the general formula $(Pb_{1-x}M_x)(Zr_yTi_{1-y})O_3$ where x and y in the formula are in a range of $0 \leq x < 1$ and $0 < y < 1$, respectively, can be employed. For M in the formula, one or more selected from the group consisting of La, Li, Na, Mg, Ca, Sr, Ba and Bi may be given. From the viewpoints of attaining the desired element characteristics, x in the formula is preferably in a range of $0 \leq x \leq 0.2$, and what is especially preferable is the one with x=0, namely, the one expressed by the general formula $Pb(Zr_yTi_{1-y})O_3$. Meanwhile, y in the formula is preferably not less than 0.3 and more preferably not less than 0.35 from the viewpoints of attaining the desired element characteristics and especially suppressing the leakage current, but preferably not greater than 0.8 and more preferably not greater than 0.7 from the viewpoints of obtaining a sufficient value of remanent polarization.

Further, in the ferroelectric layer of the present invention, the ratio of Zr to Ti (the ratio of the number of atoms, referred to as the "Zr/Ti ratio" hereinafter) for each one of the regions on the side of the lower electrode and on the side of the upper electrode is equal to or greater than that for the central section of the ferroelectric layer concerned in the direction of the thickness, and the Zr/Ti ratio of at least one of the regions on the side of the lower electrode and on the side of the upper electrode is greater than the Zr/Ti ratio of the central section. Any one of these regions on the side of the lower electrode, on the side of the upper electrode and of the central section may take the layered form.

The ferroelectric layer of this sort as a whole can take one of the following layered forms.

(1) The form wherein the Zr/Ti ratio of the region on the lower electrode side is greater than the Zr/Ti ratio of the central section of the ferroelectric layer and the Zr/Ti ratio from the central section to the region on the upper electrode side is constant.

(2) The form wherein the Zr/Ti ratio of the region on the upper electrode side is greater than the Zr/Ti ratio of the central section of the ferroelectric layer and the Zr/Ti ratio from the central section to the region on the lower electrode side is constant.

(3) The form wherein the Zr/Ti ratios of the regions on the upper electrode side and on the lower electrode side are both greater than the Zr/Ti ratio of the central section.

Figure 1:
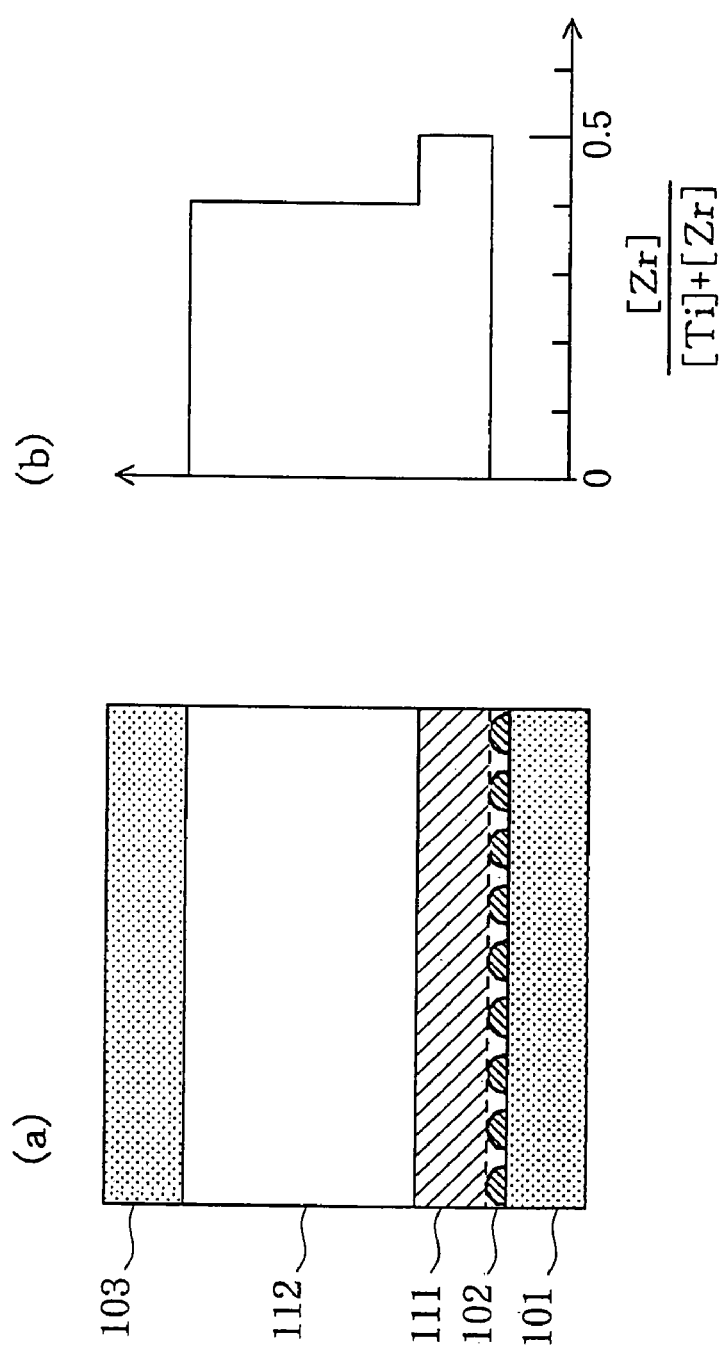
FIG. 1 is a pair of views in explaining a capacitor in a semiconductor memory device of the present invention.
Figure 2:
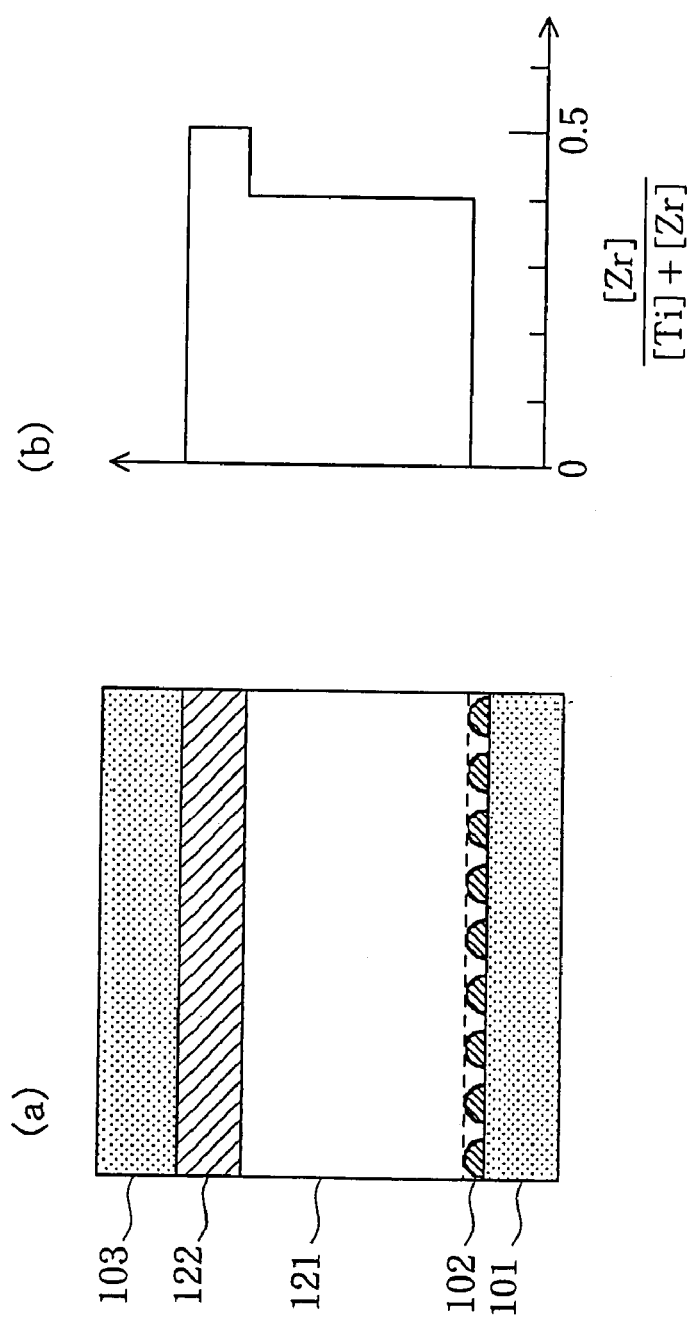
FIG. 2 is a pair of views in explaining a capacitor in a semiconductor memory device of the present invention.
Figure 3:
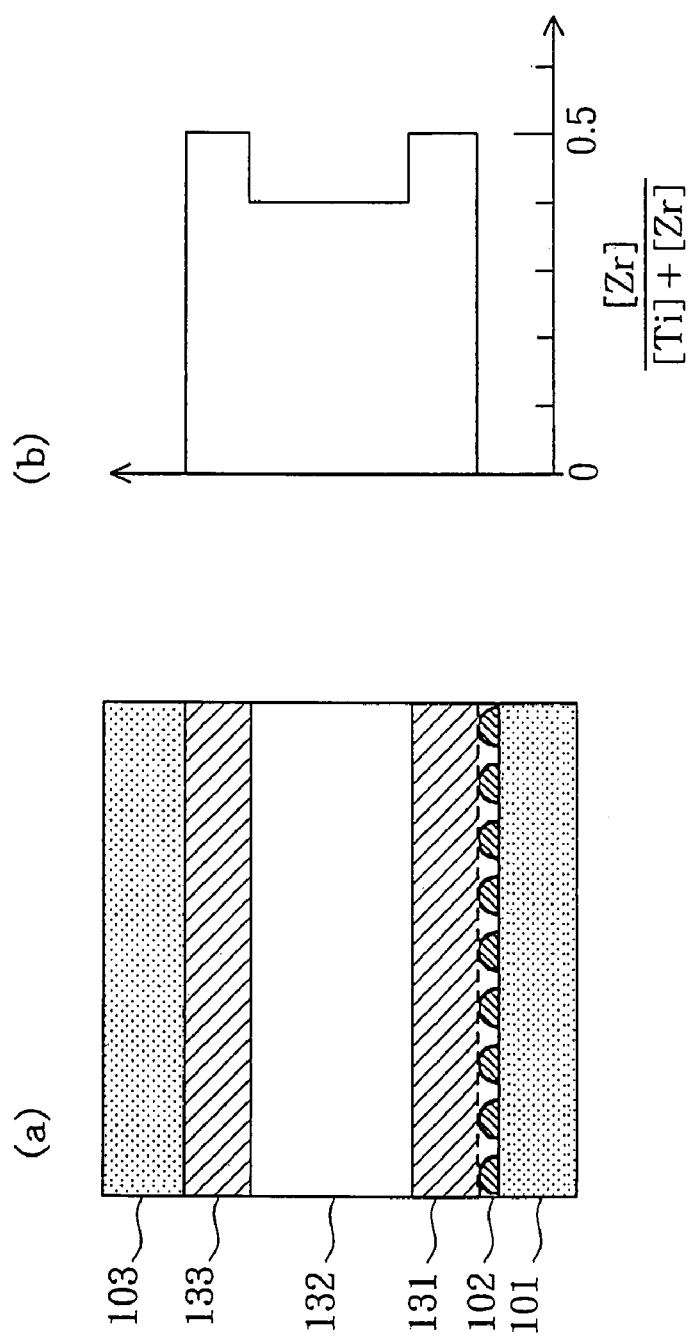
FIG. 3 is a pair of views in explaining a capacitor in a semiconductor memory device of the present invention.

As examples for the above layered forms (1) to (3), the structures shown in FIGS. 1 to 3 can be given, respectively. In every one of FIGS. 1 to 3, (a) displays a cross-sectional view of a capacitor and (b), a graphical representation where the position in the direction of the thickness of the cross-sectional view is plotted in ordinate and the Zr content ratio, in abscissa.

In FIG. 1, an example that structurally embodies the layered form (1) is shown. On a growth-nucleus layer 102 formed on a lower electrode 101, there is set a first ferroelectric layer 111 where the Zr/Ti ratio is constant, which corresponds to the afore-mentioned region on the lower electrode side, and thereon a second ferroelectric layer 112 having another constant Zr/Ti ratio is formed. An upper electrode 103 is disposed on this second ferroelectric layer 112. As shown in FIG. 1(b), the Zr/Ti ratio of the first ferroelectric layer 111 is set to be higher than that of the second ferroelectric layer 112.

In FIG. 2, an example that structurally embodies the layered form (2) is shown. On a growth-nucleus layer 102 formed on a lower electrode 101, there is set a first ferroelectric layer 121 where the Zr/Ti ratio is constant, and thereon a second ferroelectric layer 122 having another constant Zr/Ti ratio, which corresponds to the afore-mentioned region on the upper electrode side, is formed. An upper electrode 103 is disposed on this second ferroelectric layer 122. As shown in FIG. 2(b), the Zr/Ti ratio of the second ferroelectric layer 122 is set to be higher than that of the first ferroelectric layer 121.

In FIG. 3, an example that structurally embodies the layered form (3) is shown. On a growth-nucleus layer 102 formed on a lower electrode 101, there is set a first ferroelectric layer 131 where the Zr/Ti ratio is constant, which corresponds to the afore-mentioned region on the lower electrode side, and thereon a second ferroelectric layer 132 having another constant Zr/Ti ratio, which corresponds to the afore-mentioned central section, is formed, and over that a third ferroelectric layer 133 having another constant Zr/Ti ratio, which corresponds to the afore-mentioned region on the upper electrode side, is formed. An upper electrode 103 is disposed on this third ferroelectric layer 133. As shown in FIG. 3(b), the Zr/Ti ratios of the first and third ferroelectric layers 131 and 133 are both set to be higher than that of the second ferroelectric layer 132.

Within the regions on the upper electrode side, on the lower electrode side and of the central section in the ferroelectric layer, respective Zr/Ti ratios may remain constant throughout or vary with the film thickness. However, taking the control over conditions of the film deposition into consideration, it is preferable that each region has a domain where the ratio along the direction of the film thickness is constant, as shown in FIGS. 1 to 3. Further, along the direction of the film thickness, around the border between a region on the side of an electrode and another region, the Zr/Ti ratio of the ferroelectric layer may change in steps, as shown in FIGS. 1 to 3, or vary smoothly without a break. Even if the Zr/Ti ratio changes in steps, two regions having different Zr/Ti ratios are preferably formed continuously.

In the ferroelectric layer, to attain the desired element characteristics, the ratios of the Zr/Ti ratios of the regions on the upper electrode side and on the lower electrode side with respect to the Zr/Ti ratio of the central section are each set preferably in a range of 1.05 to 2.0 and more preferably in a range of 1.1 to 1.8.

The Zr content ratio (the ratio of the number of atoms) of the regions on the upper electrode side and on the lower electrode side, namely the ratios [Zr]/([Zr]+[Ti]) can be each set appropriately within a range of 0.3 to 0.8, preferably in a range of 0.4 to 0.7 and more preferably in a range of 0.4 to 0.6. The thicknesses of these regions on the upper electrode side and on the lower electrode side are each set appropriately in a range of 10 to 100 nm and preferably in a range of 20 to 80 nm. When these thicknesses are too thin, the leakage current tends to become unable to be suppressed satisfactorily, and, on the other hand, when the thicknesses are too thick, the desired values of the remanent polarization tends to become difficult to get.

The Zr content ratio of the central section of the ferroelectric layer, namely the ratio [Zr]/([Zr]+[Ti]) can be set appropriately within a range of 0.2 to 0.7, preferably in a range of 0.3 to 0.6 and more preferably in a range of 0.3 to 0.5. The thickness of this region of the central section of the ferroelectric layer is set appropriately in a range of 50 to 400 nm and preferably in a range of 100 to 300 nm. When this thickness is too thin, the desired value of the remanent polarization tends to become difficult to get, and, on the other hand, when the thickness is too thick, a satisfactory value of the remanent polarization may become difficult to get in the low voltage region.

Although the ratio of the total thickness of the region on the upper electrode side and the region on the lower electrode side to the thickness of the whole ferroelectric layer is set appropriately, depending on the Zr/Ti ratios of respective regions of the ferroelectric layer, it may be set, for example, in a range of 0.05 to 0.5, and preferably in a range of 0.1 to 0.5 or 0.1 to 0.4, viewed from the points of the leakage current suppression and the attainment of satisfactory values of the remanent polarization.

When the Zr/Ti ratio of the ferroelectric layer changes continuously along the direction of the film thickness, ranges of thicknesses and ranges of the Zr/Ti ratios (or Zr content ratios) described above for the regions on the upper electrode side, on the lower electrode side and of the central section herein only indicate ranges for the parts of respective regions where the Zr/Ti ratios are constant.

In the ferroelectric layer of the present invention, the region on the upper electrode side and the region on the lower electrode side are preferably disposed to lie adjacent to the upper electrode and the lower electrode, respectively. However, with respect to the region on the lower electrode side, in the case that a growth-nucleus layer is formed as described below, the growth-nucleus layer is preferably disposed to lie between the lower electrode and the region on the lower electrode side.

While the ferroelectric layer can be formed by the chemical vapor deposition (CVD) method, the sol-gel method, the sputtering method, the laser abrasion method and such, the CVD method is preferable because it can provide excellent film-uniformity and step-coverage. Among various CVD methods, the metal organic chemical vapor deposition method (MOCVD method) is particularly preferable.

For the lower electrode and the upper electrode disposed to sandwich the ferroelectric layer, electrodes whose main component is ruthenium (Ru), ruthenium oxide (RuO, $RuO_2$), iridium (Ir), iridium oxide ($IrO_2$), platinum (Pt), gold (Au), titanium nitride (TiN) or the like may be employed. These electrodes can be formed by the CVD method, the sputtering method or the like.

Next, a manufacturing method of a semiconductor memory device having a capacitor which comprises the afore-mentioned ferroelectric layer, lower electrode and upper electrode is described below.

Firstly, on a first interlayer insulating film set on a semiconductor substrate where active elements such as transistors are formed, a lower electrode is formed. Thereat, for instance, a TiN film or a layered film of Ti and TiN (such as a Ti/TiN/Ti layered film) may be formed as a barrier film by the sputtering method and, thereon, to form a lower electrode a conductive film with a thickness of 100 nm or so may be formed of, for example, Ru by the sputtering method or the CVD method. Patterning to form the lower electrode can be conducted just after this conductive film is formed, or alternatively all patterning can be made together after a conductive film to form an upper electrode as well as a ferroelectric film are all formed. Further, the lower electrode is disposed so as to make electrical connections with plugs which are set within the first interlayer insulating film and connecting to active elements.

Next, either on the conductive film which is to be used to form the lower electrode or on the patterned lower electrode, a growth-nucleus layer with a thickness of 1 to 10 nm or so, for instance, 5 nm is formed by the MOCVD method, and then on this growth-nucleus layer a ferroelectric film which is to be used to form the afore-mentioned ferroelectric layer with a thickness of 50 to 500 nm or so, for instance, 250 nm is formed. Next, on this ferroelectric film, to form an upper electrode, a conductive film with a thickness of 100 nm or so is formed of, for example, Ru by the sputtering method or the CVD method. After that, the barrier film, the conductive film for the lower electrode, the ferroelectric film and the conductive film for the upper electrode are patterned by means of dry etching, or alternatively, in the case that the lower electrode has been already formed, patterning is applied only onto the ferroelectric film and the conductive film for the upper electrode, and thereby a capacitor element comprising the lower electrode, the growth-nucleus layer, the ferroelectric layer and the upper electrode is formed.

On the capacitor element formed as described above, a second interlayer insulating film is formed, and, within this second interlayer insulating film, plugs which make electrical connections with the upper electrode are formed and, subsequently, interconnections connecting to these plugs are formed.

A method of forming a ferroelectric film using the MOCVD method is further described below.

A number of organic metal materials are solid or liquid at room temperature, and when materials in a state of solidity or liquidity are utilized, these materials are normally vaporized by heating and, if circumstances require, together with a carrier gas, transported into a vacuum vessel (deposition chamber) wherein a substrate is mounted. During the film deposition, the inside of the vacuum vessel is kept under a prescribed reduced pressure, and a film may be grown on the substrate which is being heated to a prescribed temperature. Such a treatment can be made using a known chemical vapor deposition apparatus for the MOCVD. Thereat, in respect of control over the source gas composition ratio, it is preferable to regulate the temperature of the internal walls of the source feeding system and the vacuum vessel so that the temperature may become equal to or higher than the temperature at which the source material can have an elimination rate (vapor pressure) high enough to avoid condensing on the internal walls, but not higher than the temperature at which the source material is decomposed.

The formation of the ferroelectric film by the MOCVD method is preferably carried out at a temperature not higher than 450° C. in order to form a ferroelectric film of good orientation and excellent crystalline quality without degrading plugs, interconnections or transistors in lower layers. On the other hand, to attain a satisfactory film deposition rate and excellent film quality, it is carried out at a temperature preferably not lower than 300° C. and more preferably not lower than 350° C. In particular, when the film deposition is made at or below 450° C., it is preferable to form, in the initial stage of the film growth, growth-nucleuses with crystalline quality as good as possible. In order to form such growth-nucleuses, it is essential to form a growth-nucleus layer on the lower electrode first and thereafter grow the ferroelectric film. The formation of this growth-nucleus layer can be carried out in a range of the deposition temperature for the ferroelectric film described above.

For the growth-nucleus layer of this sort, the afore-mentioned Pb-based ferroelectric material with a [Zr]/([Zr]+[Ti]) ratio of 0.15 or less can be employed and, in respect of the crystalline quality, the material containing no Zr is preferable. For example, lead titanate ($PbTiO_3$) can be used. Further, although this growth-nucleus layer can be a continuous film covering the whole lower electrode, it is preferable to take the shape of a plurality of islands formed with high density. Further, the thickness of the growth-nucleus layer is preferably in a range of 1 to 10 nm. Through the formation of such a growth-nucleus layer, distortion of the electric field and lowering of the permittivity can be suppressed and, moreover, control over the orientation as well as the grain size of crystals may become easier.

As the MOCVD material, there may be employed, for example, lead bisdipivaloylmethanate ($Pb(DPM)_2$) for Pb, titanium isopropoxide ($Ti(OiPr)_4$) for Ti, zirconium butoxide ($Zr(OtBu)_4$) for Zr and nitrogen dioxide ($NO_2$) as an oxidizing agent.

Now, using these materials, a layer of lead titanate and a film of $Pb(Zr_yTi_{1-y})O_3$ are formed as a growth-nucleus layer and a ferroelectric film, respectively. The actual film deposition may be carried out, for example, in the following way.

First, a substrate where a conductive film for the lower electrode has been already formed is set within the vacuum vessel. During the film deposition, the total pressure of the gases in the vacuum vessel and the substrate temperature are kept, for instance, 50 m Torr (6.7 Pa) and 450° C. or lower, respectively. In the manufacturing method of the present invention, the temperature of the film deposition is not necessarily required to be kept constant through the steps of forming a growth-nucleus layer and a ferroelectric film, and, therefore, for example, it is possible to perform the formation of the growth-nucleus layer at a relatively low temperature and then carry out the formation of the ferroelectric film at a temperature higher than the temperature of forming the growth-nucleus layer.

Next, $Pb(DPM)_2$ is supplied into the vacuum vessel at a prescribed flow rate for a prescribed time period and, subsequently, while supplying $Pb(DPM)_2$, $NO_2$ is also supplied thereto at a prescribed flow rate for a prescribed time period and, then, continuously supplying the same as before, another supply of $Ti(OiPr)_4$ thereto starts. Maintaining these conditions for a prescribed time period, a growth-nucleus layer in the form of a plurality of islands in structure is formed on the substrate.

Next, feeding conditions of the source materials are altered, and $Pb(DPM)_2$, $Zr(OtBu)_4$, $Ti(OiPr)_4$ and $NO_2$ are each supplied at a prescribed flow rate for a prescribed time period, and thereby a ferroelectric film with a prescribed thickness is formed. According to the afore-mentioned layered form (1) to (3) that is to be formed, the Zr/Ti ratio and the thickness for each region are, thereat, regulated through changes in the ratio of feeding rates for source materials and the feeding time period.

After the formation of the ferroelectric film is completed, a conductive film to form the upper electrode is formed thereon by the sputtering method or the CVD method.

In a manufacturing method of the present invention, in the steps of forming a growth-nucleus layer and a ferroelectric film, or at least in the step of forming a ferroelectric film, when conditions of the film deposition such as feeding rates for source materials are changed to form another region with a different Zr/Ti ratio, the deposition of the film is preferably carried out continuously without setting the step of standing by in which no source material is supplied onto the film source in course of formation. By making continuous deposition of the film, the elimination of the element A from the film surface in course of formation may be suppressed and, consequently, a ferroelectric film of excellent crystalline quality can be formed. It is also possible to make the film deposition continuously when conditions of the film deposition are changed from those for the formation of the growth-nucleus layer to those for the ferroelectric film.

Further, in the step of forming a ferroelectric film, at least one of the deposition rates for the regions on the lower electrode side and on the upper electrode side is preferably set to be lower than the deposition rate for the central section of that ferroelectric film in the direction of the thickness. Especially when a region on the side of an electrode with a large Zr/Ti ratio is formed, the deposition rate is preferably set lower than that when forming the other region with a relatively small Zr/Ti ratio. In this way, regardless of Zr/Ti ratio, the crystalline quality may be improved. In respect of productivity, it is preferable that only the deposition rate for the region on the side of an electrode whose Zr/Ti ratio is set large is made low, and the deposition rate for the other region with a relatively small Zr/Ti ratio is made as high as possible within the limits that the crystalline quality is not adversely affected. For instance, in the structure shown in FIG. 1, the deposition rate for the first ferroelectric layer 111 is preferably set lower than the deposition rate for the second ferroelectric layer 112. In the structure shown in FIG. 2, the deposition rate for the second ferroelectric layer 122 is preferably set lower than the deposition rate for the first ferroelectric layer 121. In the structure shown in FIG. 3, the deposition rates for the first and third ferroelectric layers 131 and 133 are preferably set lower than the deposition rate for the second ferroelectric layer 132. The deposition rates of the regions on the side of an electrode, especially the deposition rate of the region on the side of an electrode with a large Zr/Ti ratio is set to be preferably lower than 0.15 nm/sec and more preferably equal to or lower than 0.1 nm/sec for attaining satisfactory crystalline quality, but set to be preferably not lower than 0.01 nm/sec and more preferably not lower than 0.05 nm/sec in respect of productivity. The deposition rate of another region with a relatively small Zr/Ti ratio is set to be preferably not lower than 0.1 nm/sec and more preferably not lower than 0.15 nm/sec from the viewpoint of productivity, but set to be preferably 0.5 nm/sec or lower and more preferably 0.3 nm/sec or lower from the viewpoint of crystalline quality.

EXAMPLES

With reference to Examples, the present invention is further described in detail below. However, the present invention is not limited by any of the details of the description.

Example 1

Following the above method, the undermentioned capacitor element with a layered structure shown in FIG. 1 was fabricated.
Upper electrode: Ru film with a thickness of 100 nm,
Lower electrode: Ru film with a thickness of 100 nm,
Growth-nucleus layer: Lead titanate ($PbTiO_3$) layer
  with a thickness of 5 nm,
  Deposition temperature: 360° C.
First ferroelectric layer: $Pb(Zr_yTi_{1-y})O_3$ layer (y=0.5)
  with a thickness of 50 nm,
  Deposition rate: 0.09 nm/sec,
  Deposition temperature: 440° C.
Second ferroelectric layer: $Pb(Zr_yTi_{1-y})O_3$ layer (y=0.4)
  with a thickness of 200 nm,
  Deposition rate: 0.17 nm/sec,
  Deposition temperature: 440° C.

Example 2

Following the above method, the undermentioned capacitor element with a layered structure shown in FIG. 2 was fabricated.
Upper electrode: Ru film with a thickness of 100 nm,
Lower electrode: Ru film with a thickness of 100 nm,
Growth-nucleus layer: Lead titanate ($PbTiO_3$) layer
  with a thickness of 5 nm,
  Deposition temperature: 360° C.
First ferroelectric layer: $Pb(Zr_yTi_{1-y})O_3$ layer (y=0.4)
  with a thickness of 200 nm,
  Deposition rate: 0.17 nm/sec,
  Deposition temperature: 440° C.
Second ferroelectric layer: $Pb(Zr_yTi_{1-y})O_3$ layer (y=0.5)
  with a thickness of 50 nm,
  Deposition rate: 0.09 nm/sec
  Deposition temperature: 440° C.

Comparative Example 1

A capacitor element was fabricated in the same way as Example 1, excepting that a ferroelectric layer of $Pb(Zr_yTi_{1-y})O_3$ (y=0.4) with a thickness of 250 nm was formed at a deposition rate of 0.17 nm/sec.

Element Characteristics

Figure 4:
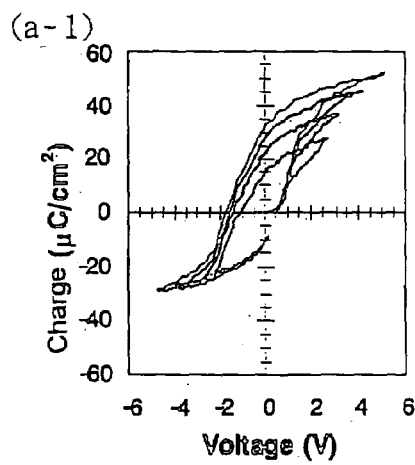
FIG. 4 is a group of views showing hysteresis characteristics and current-voltage characteristics for capacitors of Examples and Comparative example.
Figure 4:
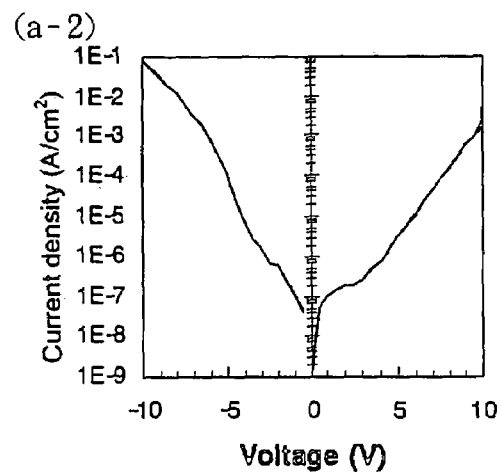
Figure 4:
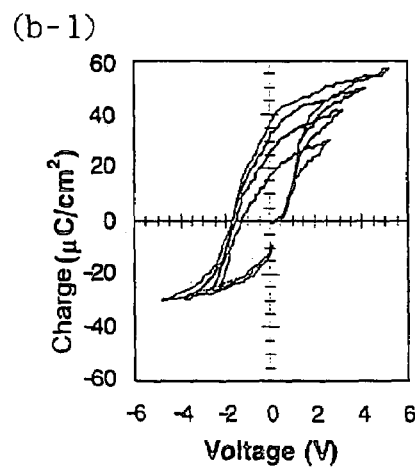
Figure 4:
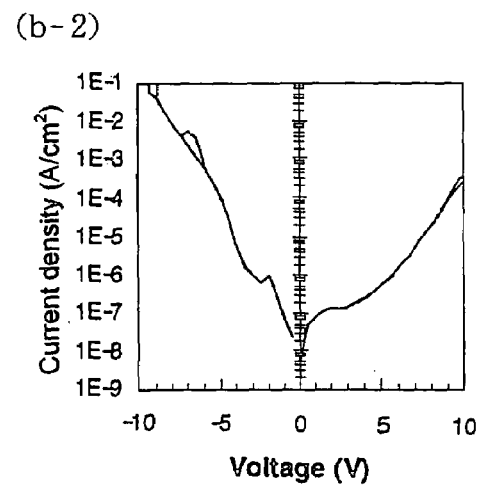
Figure 4:
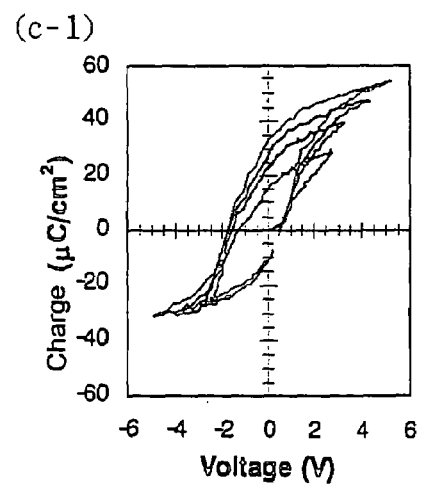
Figure 4:
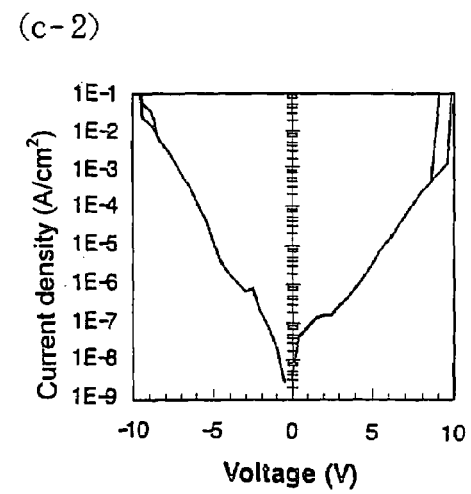

Hysteresis characteristics and current-voltage characteristics for capacitors of Example 1, Example 2 and Comparative example 1 are shown in FIG. 4. Hysteresis characteristics and current-voltage characteristics for a capacitor of Example 1 are shown in FIGS. 4(*a*-1) and (*a*-2), respectively, and hysteresis characteristics and current-voltage characteristics for a capacitor of Example 2 are shown in FIGS. 4(*b*-1) and (*b*-2), respectively, while hysteresis characteristics and current-voltage characteristics for a capacitor of Comparative example 1 are shown in FIGS. 4(*c*-1) and (*c*-2), respectively. Current-voltage characteristics in FIGS. 4(*a*-2), (*b*-2) and (*c*-2) show the absolute values of the current when a voltage in a range between +10 V and −10 V is applied thereto. Hysteresis characteristics in FIGS. 4(*a*-1), (*b*-1) and (*c*-1) present superimposed loops of hysteresis (single-shot hysteresis), each obtained by applying an ambipolar single-shot voltage sweep of ±2.5V, ±3.0 V, ±4.0 V or ±5.0 V.

As seen clearly in the current-voltage characteristics, shown in FIGS. 4(*a*-2) to (*c*-2), although the leakage current arises in a capacitor of Comparative example 1, the leakage currents are well suppressed in capacitors of Examples 1 and 2. Furthermore, hysteresis characteristics for capacitors of Examples 1 and 2 remain equivalent to those for the capacitor of Comparative example 1, indicating that the leakage currents in Examples 1 and 2 were well suppressed without degrading hysteresis characteristics or lowering the values of remanent polarization thereof.

Figure 5:
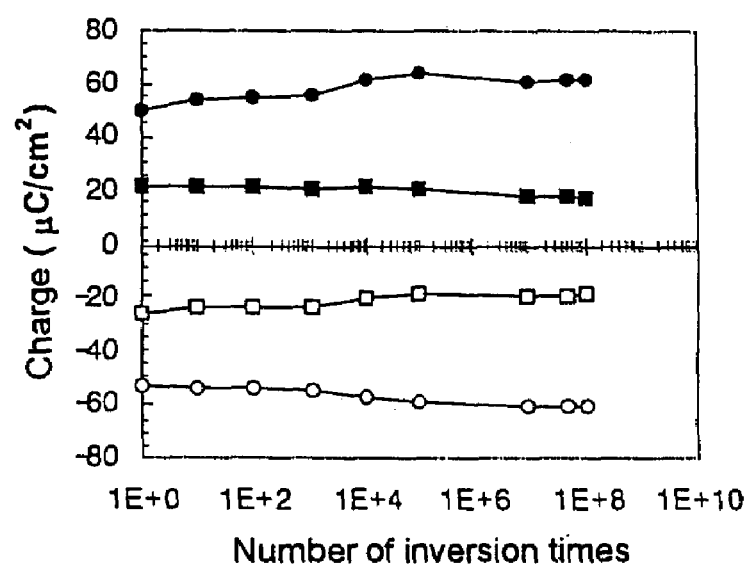
FIG. 5 is a view showing characteristics of repetitive inversion polarization for a capacitor of Example.

In FIG. 5, there are shown the results of the measurements in which after a pulse voltage of ±3.3 V was applied a prescribed number of times to a capacitor of Example 2, the amounts of inverting and non-inverting charges were both measured at +3 V and −3 V. Plots with black dots in the drawing indicate the amounts of inverting and non-inverting charges at +3 V, while plots with white dots indicate the amounts of inverting and non-inverting charges at −3 V. Because the inverting and non-inverting charges hardly showed any deterioration, even when repetitive inversion was made up to $10^8$ times, in the present invention, the leakage current was considered to be well suppressed while repetitive inversion of polarization hardly gives rise to deterioration of read-out charges.

What is claimed is:

1. A semiconductor memory device having a capacitor which comprises a ferroelectric layer with the perovskite crystal structure which, being expressed by the general formula $ABO_3$, contains lead (Pb) as the element A occupying lattice A and zirconium (Zr) and titanium (Ti) as the element B occupying lattice B, and a lower electrode and an upper electrode which are disposed to sandwich said ferroelectric layer; wherein said ferroelectric layer has, both on the side of said lower electrode and on the side of said upper electrode, a region each, in which a ratio of Zr to Ti (a Zr/Ti ratio) is equal to or greater than a Zr/Ti ratio of the central section of said ferroelectric layer in the direction of thickness, and the Zr/Ti ratio of at least one of the regions on the side of said lower electrode and on the side of said upper electrode is from 1.05 to 2.0 times the Zr/Ti ratio of said central section.

2. A semiconductor memory device according to claim 1, wherein said ferroelectric layer has a first ferroelectric layer which is formed on said lower electrode and a second ferroelectric layer which is formed on said first ferroelectric layer and adjacent to said upper electrode, and a Zr/Ti ratio of said first ferroelectric layer is greater than a Zr/Ti ratio of said second ferroelectric layer.

3. A semiconductor memory device according to claim 1, wherein said ferroelectric layer has a first ferroelectric layer which is formed on said lower electrode and a second ferroelectric layer which is formed on said first ferroelectric layer and adjacent to said upper electrode, and a Zr/Ti ratio of said second ferroelectric layer is greater than a Zr/Ti ratio of said first ferroelectric layer.

4. A semiconductor memory device according to claim 2, wherein the Zr/Ti ratios of said first and second ferroelectric layers are each constant along the direction of thickness.

5. A semiconductor memory device according to claim 3, wherein the Zr/Ti ratios of said first and second ferroelectric layers are each constant along the direction of thickness.

6. A semiconductor memory device according to claim 1, wherein said ferroelectric layer has a first ferroelectric layer which is formed on said lower electrode, a second ferroelectric layer which is formed on said first ferroelectric layer and a third ferroelectric layer which is formed on said second ferroelectric layer and adjacent to said upper electrode, and Zr/Ti ratios of said first and third ferroelectric layers are greater than a Zr/Ti ratio of said second ferroelectric layer.

7. A semiconductor memory device according to claim 6, wherein the Zr/Ti ratios of said first, second and third ferroelectric layers are each constant along the direction of thickness.

8. A semiconductor memory device according to claim 1, which further comprises, on said lower electrode, a growth-nucleus layer with the perovskite crystal structure, wherein said ferroelectric layer is formed to overlie said growth-nucleus layer.

9. A semiconductor memory device according to claim 8, wherein said growth-nucleus layer is formed in the shape of a plurality of islands.

10. A semiconductor memory device according to claim 8, wherein said growth-nucleus layer is made of a material with the perovskite crystal structure containing no Zr.

11. A semiconductor memory device according to claim 8, wherein said growth-nucleus layer is made of lead titanate ($PbTiO_3$).

12. A semiconductor memory device according to claim 1, wherein said ferroelectric layer has the perovskite crystal structure expressed by the general formula $Pb(Zr_y Ti_{1-y})O_3$ ($0<y<1$).

13. A semiconductor memory device according to claim 1, wherein the Zr/Ti ratio of at least one of the regions on the side of said lower electrode and on the side of said upper electrode is from 1.1 to 1.8 times the Zr/Ti ratio of said central section.

* * * * *